United States Patent
Sato

(10) Patent No.: US 9,679,950 B2
(45) Date of Patent: Jun. 13, 2017

(54) ORGANIC EL DISPLAY DEVICE

(71) Applicant: Japan Display Inc., Tokyo (JP)

(72) Inventor: Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/678,176

(22) Filed: Apr. 3, 2015

(65) Prior Publication Data
US 2015/0287770 A1 Oct. 8, 2015

(30) Foreign Application Priority Data
Apr. 8, 2014 (JP) .................................. 2014-079778

(51) Int. Cl.
*H01L 27/32* (2006.01)
*H01L 51/52* (2006.01)

(52) U.S. Cl.
CPC ...... *H01L 27/3246* (2013.01); *H01L 51/5259* (2013.01); *H01L 51/5253* (2013.01)

(58) Field of Classification Search
CPC ......... H01L 2251/5315; H01L 27/3244; H01L 51/5284; H01L 27/3246
See application file for complete search history.

(56) References Cited

U.S. PATENT DOCUMENTS

| 2002/0030193 A1* | 3/2002 | Yamazaki | H01L 51/5281 257/98 |
| 2003/0146439 A1* | 8/2003 | Yamazaki | H01L 27/3246 257/79 |
| 2012/0326143 A1* | 12/2012 | Tsurume | H01L 27/1225 257/43 |
| 2013/0236662 A1* | 9/2013 | Dua | B32B 7/04 428/34 |
| 2015/0069376 A1* | 3/2015 | Son | B32B 37/12 257/40 |
| 2015/0311267 A1* | 10/2015 | Kim | H01L 51/0037 257/88 |

FOREIGN PATENT DOCUMENTS

JP 2010-129334 A 6/2010

* cited by examiner

*Primary Examiner* — Jaehwan Oh
(74) *Attorney, Agent, or Firm* — Typha IP LLC

(57) ABSTRACT

An organic EL display device includes a lower electrode that is provided at each pixel, a bank that surrounds an outer circumference of the lower electrode and overlaps an outer circumferential edge of the lower electrode, an organic layer that is formed on the lower electrode and the bank, and an upper electrode that is formed on the organic layer. The bank contains a hygroscopic material. According to this display device, it is possible to confine an influence of moisture which has permeated thereinto to a more restricted area.

23 Claims, 11 Drawing Sheets

ORGANIC EL DISPLAY DEVICE

CROSS-REFERENCE TO RELATED APPLICATION

The present application claims priority from Japanese application JP2014-079778 filed on Apr. 8, 2014, the content of which is hereby incorporated by reference into this application.

BACKGROUND OF THE INVENTION

1. Field of the Invention

The present invention relates to an organic EL display device, and particularly to a technique for reducing an influence of moisture on an organic layer.

2. Background Art

There are organic EL display devices which have a lower electrode connected to a circuit layer including a thin film transistor (hereinafter, referred to as a TFT). A bank which partitions two adjacent pixels is formed at the edge of the lower electrode. An organic layer including a light emitting layer is formed to cover the lower electrode and the bank. An upper electrode is formed on the organic layer, and is covered by a sealing layer. In some cases, moisture permeates into the display device due to a foreign particle which has entered the sealing layer or pinholes generated in the sealing layer in a manufacturing process. An organic EL display device disclosed in JP 2010-129334 A has a getter layer (hereinafter, referred to as a hygroscopic layer) made of a material which can adsorb moisture in order to reduce an influence of moisture on an organic layer. The hygroscopic layer covers the upper electrode and is formed over a plurality of pixels.

SUMMARY OF THE INVENTION

The structure disclosed in JP 2010-129334 A has the following problems. The hygroscopic layer is formed over a plurality of pixels, and the upper electrode is located between the hygroscopic layer and the organic layer. For this reason, in a case where interfusion of a foreign particle or a pinhole which may cause the permeation of moisture are caused in a single pixel (sub-pixel), it is difficult to confine an influence of the moisture to the single pixel. Accordingly, after the organic EL display device is used for a long period of time, the influence of the moisture (for example, a dark spot) may spread to a plurality of pixels around the pixel in which the interfusion of a foreign particle or a pinhole is caused.

In addition, moisture in the hygroscopic layer is preferably completely removed in advance. An annealing process is effective in order to remove the moisture. However, in the structure disclosed in JP 2010-129334 A, the hygroscopic layer is formed above the organic layer, and thus such an annealing process on the hygroscopic layer cannot be performed.

A first object of the present invention is to provide an organic EL display device which can confine, to a more restricted area, an influence of moisture which has permeated into the organic EL display device.

A second object of the present invention is to provide an organic EL display device which can more effectively remove moisture from a hygroscopic material in a manufacturing process.

(1) In order to achieve the first object, an organic EL display device includes a lower electrode provided at each pixel; a bank surrounding an outer circumference of the lower electrode and overlapping an outer circumferential edge of the lower electrode; an organic layer formed on the lower electrode and the bank; and an upper electrode formed on the organic layer. The bank contains a hygroscopic material. According to the organic EL display device, it is possible to confine, to a restricted area, an influence of moisture which has permeated thereinto on the organic layer.

(2) In the above (1), the bank may be made of the hygroscopic material or a material into which the hygroscopic material is mixed. According to this configuration, it is possible to simplify a manufacturing process of the organic EL display device.

(3) In the above (1), the organic EL display device may comprise a plurality of pixels. The bank may include, in a part of the bank, a portion made of the hygroscopic material, and the portion made of the hygroscopic material may be provided at each of the plurality of pixels. According to this configuration, it is possible to confine, to a more restricted area, an influence of moisture which has permeated into the organic EL display device on the organic layer.

(4) In the above (3), the bank may include a first portion that is made of the hygroscopic material and a second portion that is made of a material different from the hygroscopic material of the first portion, and the second portion may be formed above the first portion and forms a surface of the bank. According to this configuration, even if a surface of a material forming the first portion is rough, an influence of the roughness on the organic layer can be prevented by the second portion.

(5) In the above (3), the bank may include a first portion that is made of the hygroscopic material and a second portion that is made of a material different from the hygroscopic material of the first portion, and the first portion may be formed above the second portion and forms a surface of the bank. According to this configuration, since the first portion containing the hygroscopic material is in contact with the organic layer, it is possible to more effectively reduce an influence of moisture on the organic layer.

(6) In the above (3), the organic EL display device may include a circuit layer formed below the lower electrode and connected to the lower electrode through a contact hole. The bank may include a region covering the contact hole, and the portion made of the hygroscopic material may be located in the region covering the contact hole. The portion covering the contact hole has a width larger than other portions of the bank. For this reason, according to the above-described configuration, it is possible to secure an appropriate width of the portion made of the hygroscopic material. As a result, even in a case where a hygroscopic material is difficult to be patterned in a narrow region, it is possible to easily form the portion made of the hygroscopic material.

(7) In any one of the above (3) to (5), the outer circumferential edge of the lower electrode may include a plurality of outer edges which extend in different directions each other, and the portion made of the hygroscopic material may be located on at least two adjacent outer edges among the plurality of outer edges of the lower electrode. According to this configuration, it is possible to confine an influence of moisture which has permeated into the organic EL display device on the organic layer to a more restricted area.

(13) In order to achieve the second object, an organic EL display device includes a substrate; a lower electrode formed on the substrate and provided at each pixel; a bank surrounding an outer circumference of the lower electrode; an organic layer formed on the lower electrode and the bank; an upper electrode formed on the organic layer; and a layer formed between the substrate and the organic layer, and containing a hygroscopic material. According to the organic EL display device, in a manufacturing process of the organic EL display device, moisture contained in the hygroscopic material can be removed therefrom through heat treatment before forming the organic layer, and thus it is possible to more effectively reduce an influence of moisture on the organic layer.

(14) In the above (13), the layer containing the hygroscopic material may be a planarizing layer which is provided between the lower electrode and the substrate. According to this configuration, it is possible to easily secure an area of the layer containing the hygroscopic material, and thus to more effectively reduce an influence of moisture on the organic layer.

(15) In the above (13), the layer containing the hygroscopic material may be a layer which is located under the lower electrode and in physical contact with the lower electrode.

(16) In the above (13), a planarizing layer may be provided between the lower electrode and the substrate, and the layer containing the hygroscopic material may be disposed on the planarizing layer.

In any one of the above (1) to (16), the hygroscopic material may include alkaline earth metal oxide. In any one of the above (1) to (16), the hygroscopic material may include anyone of calcium oxide, barium oxide, magnesium oxide, strontium oxide, and radium oxide. In any one of the above (1) to (16), the hygroscopic material may include a sulfate. In any one of the above (1) to (16), the hygroscopic material may include anyone of calcium oxide, lithium sulfate, sodium sulfate, gallium sulfate, titanium sulfate, and nickel sulfate. In anyone of the above (1) to (16), the hygroscopic material may include silica gel.

DETAILED DESCRIPTION OF THE INVENTION

Figure 1:
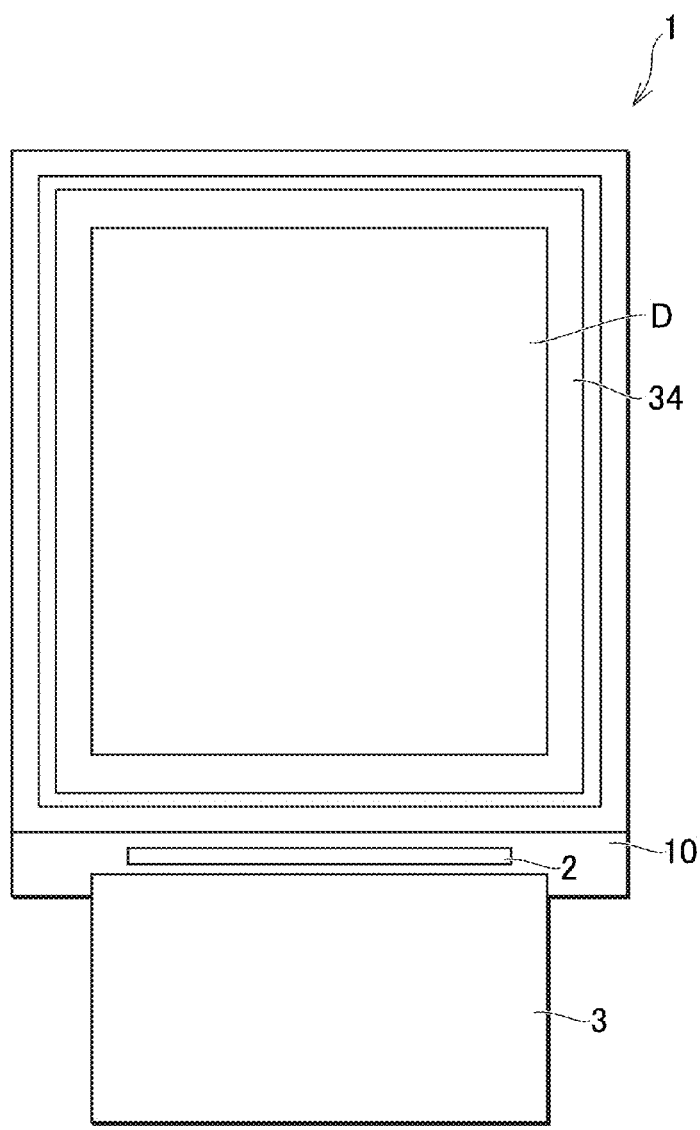
FIG. 1 is a plan view of an organic EL display device according to the present invention.
Figure 2:
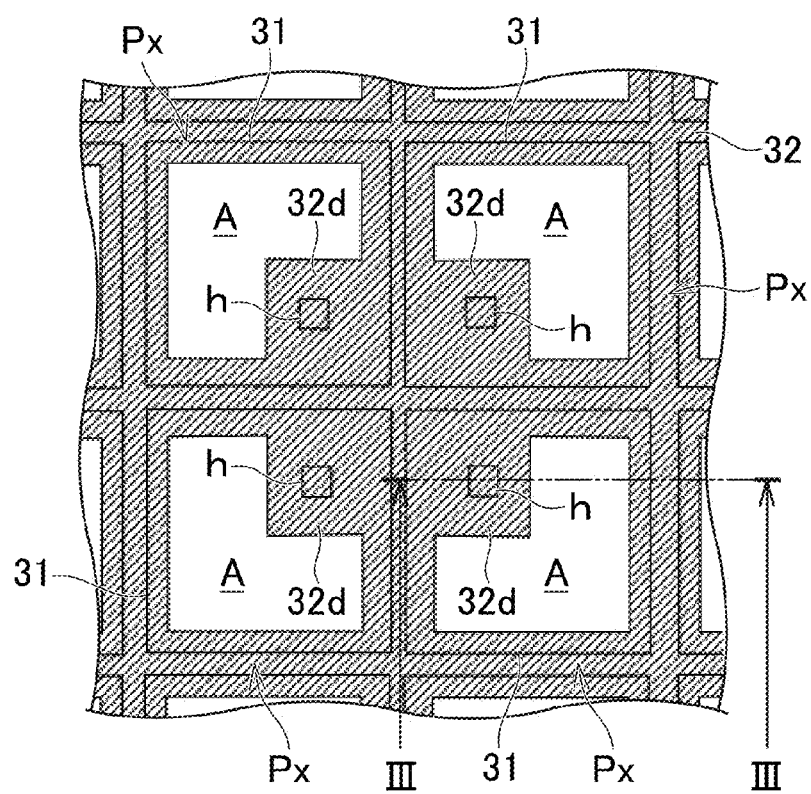
FIG. 2 is a plan view illustrating a lower electrode and a bank of the organic EL display device.
Figure 3:
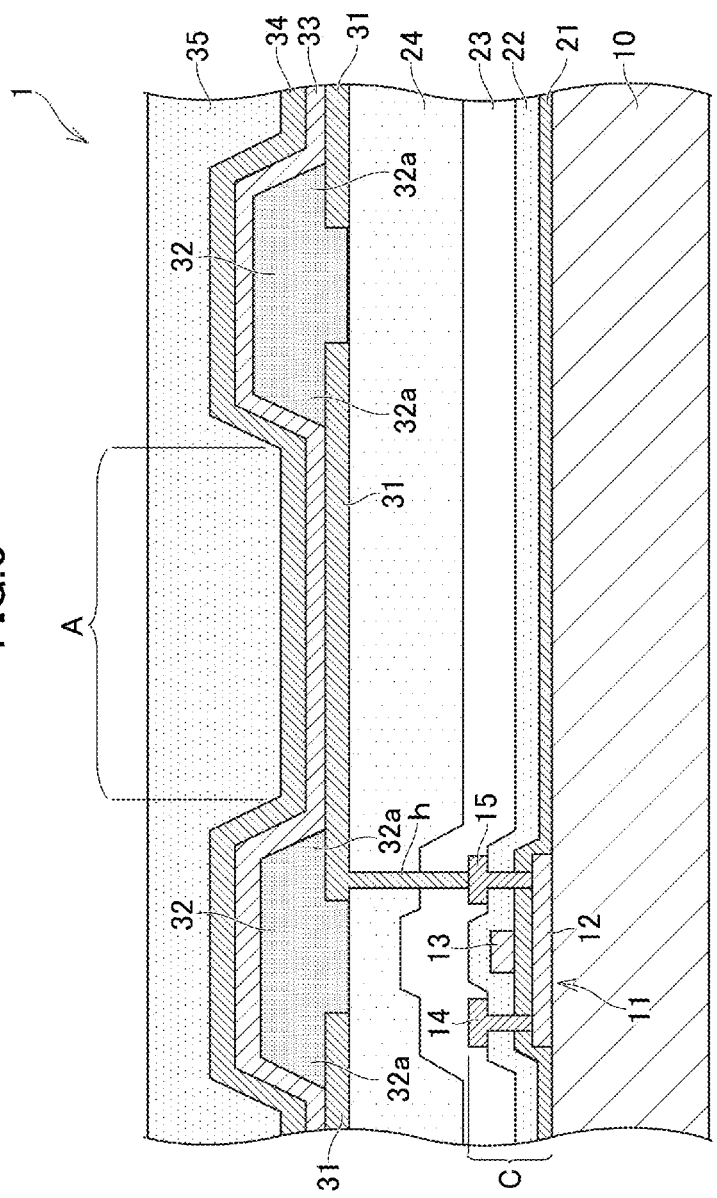
FIG. 3 is a cross-sectional view of the organic EL display device taken along the line III-III illustrated in FIG. 2.

Hereinafter, an embodiment of the present invention will be described with reference to the drawings. FIG. 1 is a plan view of an organic electroluminescent (EL) display device 1 according to the present invention. FIG. 2 is a plan view illustrating a lower electrode 31 and a bank 32 of the organic EL display device 1. In FIG. 2, a hatched region indicates the bank 32. FIG. 3 is a cross-sectional view of the organic EL display device 1 taken along the line III-III illustrated in FIG. 2.

As illustrated in FIGS. 1 and 3, the organic EL display device 1 has a substrate 10. The substrate 10 is, for example, a glass substrate or a resin substrate. A driving IC 2 which drives elements (for example, a thin film transistor (TFT)) formed in a circuit layer C (refer to FIG. 3) which will be described later is installed at an edge of the substrate 10. A flexible substrate 3 which applies a video signal to the driving IC 2 is attached to the edge of the substrate 10. An upper electrode 34 which will be described later is formed on the substrate 10. The upper electrode 34 is formed over a plurality of pixels. A display region D formed of a plurality of pixels is defined inside an outer edge of the upper electrode 34. The organic EL display device 1 may be, for example, a flexible display which is entirely flexible. In this case, a resin substrate is preferably used as the substrate 10. The organic EL display device 1 may be a rigid display.

In an example of the organic EL display device 1, as illustrated in FIG. 2, four pixels (Px in FIG. 2) form a single unit. In other words, in the example of the organic EL display device 1, a single pixel is formed of four sub-pixels. The four pixels forming the single unit are a red pixel, a green pixel, a blue pixel, and a white pixel. The four pixels may be arranged, for example, in two columns and two rows as illustrated in FIG. 2. The arrangement of the pixels is not limited thereto. For example, the four pixels may be arranged in one column. In addition, three pixels may form a single unit. In other words, a single pixel may be formed of three sub-pixels. In this case, the three pixels are a red pixel, a blue pixel, and a green pixel, and may be arranged in one direction.

The circuit layer C including a TFT or a capacitor or the like is formed on the substrate 10. FIG. 3 illustrates a TFT 11 formed in the circuit layer C. The TFT 11 has a semiconductor layer 12, a gate electrode 13, a source electrode 14, and a drain electrode 15. In the example illustrated in FIG. 3, the semiconductor layer 12 is formed on the substrate 10. The semiconductor layer 12 is covered by a gate insulating layer 21. The gate electrode 13 is formed on the gate insulating layer 21 and is covered by an intermediate insulating layer 22. The source electrode 14 and the drain electrode 15 are formed on the intermediate insulating layer 22. The source electrode 14 is connected to a source region of the semiconductor layer 12 via a contact hole which is formed in the gate insulating layer 21 and the intermediate insulating layer 22. The drain electrode 15 is connected to a drain region of the semiconductor layer 12 via a contact hole which is formed in the gate insulating layer 21 and the intermediate insulating layer 22. The laminate structure of the TFT 11 illustrated in FIG. 3 is only an example, and a structure of the TFT is not limited thereto. The circuit layer C (the TFT 11 in the example illustrated in FIG. 3) may be covered by a passivation layer 23. In addition, in the example illustrated in FIG. 3, a planarizing layer 24 is formed on the passivation film 23. The planarizing layer 24 is made of, for example, a resin such as acryl.

As illustrated in FIGS. 2 and 3, the lower electrode 31 is formed above the substrate 10. More specifically, the lower electrode 31 is formed on the planarizing layer 24. The lower electrode 31 is provided at each pixel. In other words, the organic EL display device 1 includes a plurality of lower electrodes 31, and the lower electrodes 31 are provided at the respective pixels. The lower electrode 31 is connected to the drain electrode 15 of the TFT 11 via a contact hole h. In an example of the organic EL display device 1, as illustrated in FIG. 3, the contact hole h may be formed in the planarizing layer 24 and the passivation film 23. For example, the lower electrode 31 is an anode, and the upper electrode 34 to be described later is a cathode. For example, the organic EL display device 1 is of a top emission type. In this case, the lower electrode 31 may include a reflective layer. Alternatively, the reflective layer may be formed in a layer lower than the lower electrode 31. The organic EL display device 1 may be of a bottom emission type.

As illustrated in FIGS. 2 and 3, the organic EL display device 1 has the bank 32 which partitions each pixel. The bank 32 surrounds an outer circumference of each lower electrode 31 and overlaps an outer circumferential edge of the lower electrode 31. In other words, the bank 32 has a portion 32a located on the outer circumferential edge of the lower electrode 31. The bank 32 preferably surrounds the entire circumference of each lower electrode 31. As illustrated in FIG. 2, an aperture A is formed inside the bank 32, and the lower electrode 31 is exposed in the aperture A (hereinafter, the aperture A is referred to as a bank aperture A). In an example of the organic EL display device 1, the lower electrode 31 is rectangular, and the contact hole h is formed at a position near a corner thereof. As illustrated in FIG. 2, the bank 32 in the example described here has a projecting portion 32d. The projecting portion 32d projects further inward than other portions of the bank 32, and covers the portion where the contact hole h is formed. The bank aperture A has substantially an L shape due to the presence of the projecting portion 32d. A shape of the bank aperture A is not necessarily limited to an L shape, and may be changed as appropriate.

As illustrated in FIG. 3, an organic layer 33 including a light emitting layer (not illustrated) is formed on the lower electrode 31 and the bank 32. The organic layer 33 is in contact with the lower electrode 31 inside the above-described bank aperture A, and light is emitted from the region of the bank aperture A. The organic layer 33 includes not only the light emitting layer, but also all of a hole injection layer, a hole transport layer, an electron injection layer, and an electron transport layer or some thereof.

In the example illustrated in FIG. 3, the organic layer 33 is formed over the plurality of pixels. In other words, the organic layer 33 on two adjacent pixels is continuously located. As an example, the organic layer 33 includes, at each pixel, a light emitting layer which emits light with a color of the corresponding pixel. In other words, as an example, the organic layer 33 has a light emitting layer which emits red light at a red pixel, has a light emitting layer which emits green light at a green pixel, and has a light emitting layer which emits blue light at a blue pixel. In addition, in a case where the organic EL display device 1 has a white pixel, the organic layer 33 may include, at a white pixel, a plurality of light emitting layers which are laminated so as to emit white light. Alternatively, the organic layer 33 may include, at all pixels, a plurality of light emitting layers which are laminated so as to emit white light. In this case, the organic EL display device 1 may have a color filter at each pixel. The organic layer 33 may be formed separately for each of a plurality of pixels. In other words, the organic layer 33 on two adjacent pixels may not be continuously located. In this case, the outer circumferential portion of each organic layer 33 may be formed on the bank 32.

As illustrated in FIG. 3, the upper electrode 34 is formed on the organic layer 33. The upper electrode 34 is formed over the plurality of pixels. In other words, the upper electrode 34 over two adjacent pixels is continuously located. As described above, the bank 32 overlaps the outer circumferential edge of the lower electrode 31. Consequently, the outer circumferential edge of the lower electrode 31 is prevented from being in contact with the upper electrode 34. In the example illustrated in FIG. 3, a sealing layer 35 is formed on the upper electrode 34. The sealing layer 35 may not necessarily be formed. Alternatively, the sealing layer 35 may not necessarily be a single layer. In other words, the sealing layer 35 may be formed of a plurality of layers.

The bank 32 contains a hygroscopic material (desiccant) which can adsorb moisture. The bank 32 contains the hygroscopic material so that the hygroscopic material is located at each pixel. By using such a bank 32, even in a case where moisture permeates into the laminate structure on the substrate 10 due to a foreign particle being incorporated or a pinhole being generated in the sealing layer, an influence of the moisture can be confined to the single pixel. As a result, it is possible to maintain a high image quality of the organic EL display device 1 for a long period of time. Overall bank 32 may be made of a hygroscopic material. Alternatively, a part of the bank 32 may be made of a hygroscopic material. In the present specification, the phrase "made of a hygroscopic material" includes semantically the phase "made of only a hygroscopic material" and the phrase "made of a material into which a hygroscopic material is mixed (that is, the material is a mixture)".

In the example illustrated in FIG. 3, a material of the bank 32 is a hygroscopic material. In other words, overall bank 32 is made of the hygroscopic material. In the above-described manner, it is possible to simplify a process of forming the banks 32. Alternatively, overall bank 32 is made of a material (for example, a material in which a resin such as polyimide or acryl is into which a hygroscopic material is mixed) into which a hygroscopic material is mixed. Also in this case, it is possible to simplify a process of forming the bank 32.

A hygroscopic material is not particularly limited as long as the material has a function of adsorbing moisture. A hygroscopic material is preferably a compound which chemically adsorbs moisture, and is maintained in a solid state even when adsorbing moisture. Examples of the hygroscopic material include metal oxide, inorganic acid salt or organic acid salt of a metal, and the like. As the hygroscopic material, an alkaline earth metal oxide or a sulfate is preferably used. The alkaline earth metal oxide may be, for example, calcium oxide, barium oxide, magnesium oxide, strontium oxide, or radium oxide. The sulfate may be, for example, lithium sulfate, sodium sulfate, gallium sulfate, titanium sulfate, or nickel sulfate. As the hygroscopic material, silica gel, or a hygroscopic organic compound such as polyvinyl alcohol may be used. Particularly, calcium oxide, barium oxide, silica gel, or the like may be preferably used as a hygroscopic material. In addition, a hygroscopic material may contain one kind or two or more kinds selected from a natural zeolite, a synthetic zeolite, diatomaceous earth, a mixture of magnesium oxide and anhydrous magnesium chloride, oxides of the above-described alkaline earth metals, activated alumina, barium hydride, aluminum hydride, silica gel A, silica gel B, sepiolite, alumina/silica gel, bentonite, allophane, activated clay, and activated carbon and the like. The hygroscopic materials exemplified herein may be used as hygroscopic materials in an embodiment illustrated in FIGS. 4 to 11.

A bank is not limited to the above-described bank. The bank may include, only in a part thereof, a portion made of a hygroscopic material (hereinafter, this portion is referred to as a hygroscopic portion). In this case, the hygroscopic portion may be provided at each pixel.

Figure 4:
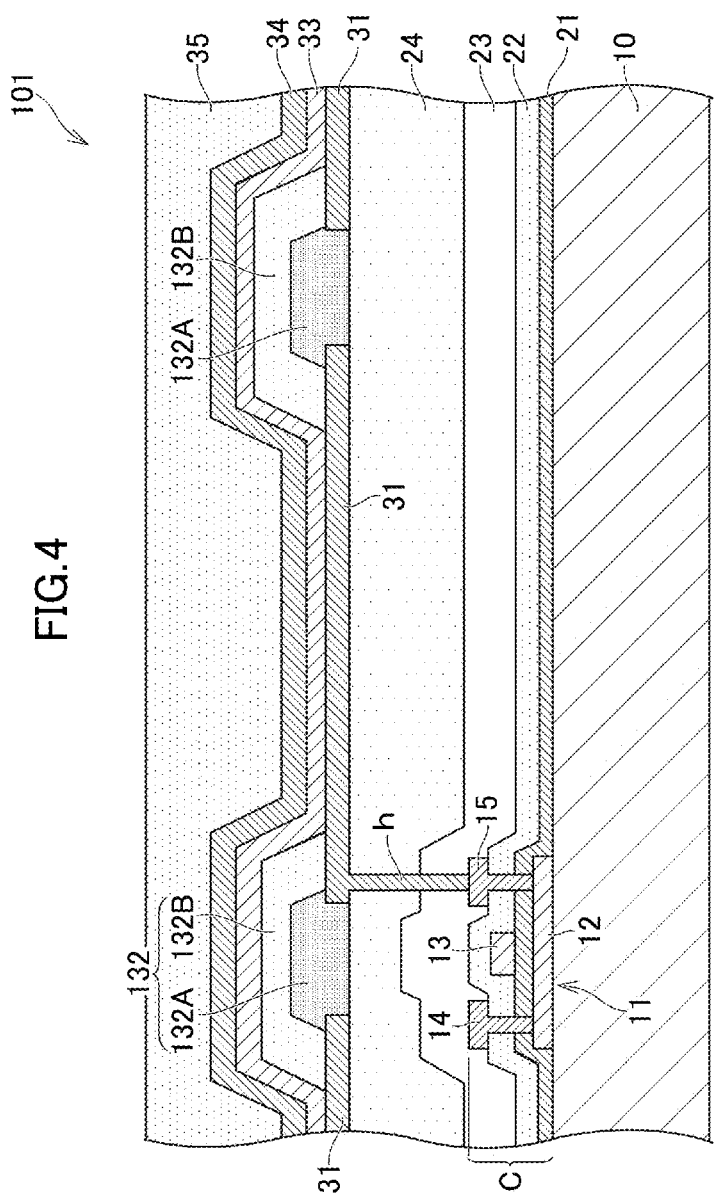
FIG. 4 is a cross-sectional view illustrating a modification example of a bank.
Figure 5:
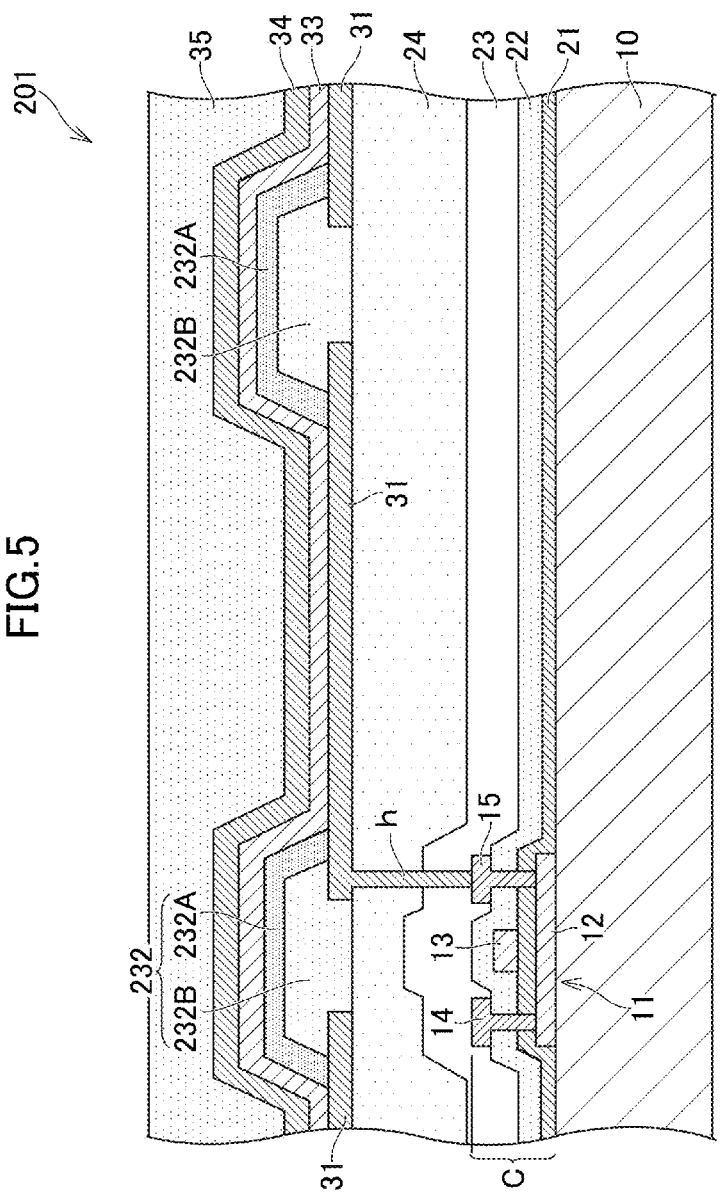
FIG. 5 is a cross-sectional view illustrating another modification example of a bank.

FIGS. 4 and 5 are cross-sectional views of the organic EL display device illustrating a modification example of the bank. In the figures, the same members as the members described hitherto are given the same reference numerals. In addition, a cross section of the figures is the same as that of FIG. 3.

As illustrated in FIG. 4, a bank 132 of an organic EL display device 101 includes a hygroscopic portion 132A made of a hygroscopic material. As an example, the hygroscopic portion 132A is made of only a hygroscopic material. As another example, the hygroscopic portion 132A is made of a material into which a hygroscopic material is mixed (that is, the material is a mixture). The bank 132 includes a less-hygroscopic portion 132B which overlaps the hygroscopic portion 132A. The less-hygroscopic portion 132B is made of a material different from that of the hygroscopic portion 132A. For example, the less-hygroscopic portion 132B is made of a material (for example, the above-described resin such as polyimide or acryl) having a hygroscopic performance lower than that of the hygroscopic portion 132A.

In the example illustrated in FIG. 4, the less-hygroscopic portion 132B is formed above the hygroscopic portion 132A. According to the bank 132, even if a surface of a material forming the hygroscopic portion 132A is rough, an influence of the roughness on the organic layer 33 can be prevented by the less-hygroscopic portion 132B. In addition, it is possible to control the hygroscopic performance of the bank 132 by adjusting a thickness of the hygroscopic portion 132A. In the example illustrated in FIG. 4, the less-hygroscopic portion 132B covers the surface of the hygroscopic portion 132A and thus forms a surface (an upper surface and a side surface which are in contact with the organic layer 33) of the bank 132. The less-hygroscopic portion 132B may be formed only on the upper surface of the hygroscopic portion 132A.

The planarizing layer 24 includes a portion exposed between two adjacent lower electrodes 31. The hygroscopic portion 132A is formed on the portion of the planarizing layer 24. In the example illustrated in FIG. 4, the hygroscopic portion 132A overlaps the outer circumferential edge of the lower electrode 31.

The hygroscopic portion 132A is located at each of the plurality of pixels. The outer circumferential edge of the lower electrode 31 has a plurality of outer edges which extend in different directions. Specifically, the outer circumferential edge of the lower electrode 31 includes right and left edges which extend in the vertical direction and upper and lower edges which extend in the horizontal direction. The hygroscopic portion 132A is formed along two adjacent outer edges among the above-described four outer edges of the lower electrode 31. For example, the hygroscopic portion 132A is formed along only two adjacent edges among the four outer edges of the lower electrode 31, or along only three edges among the four outer edges. For example, the hygroscopic portion 132A is formed along the upper and lower edges of the lower electrode 31. Preferably, the hygroscopic portion 132A is formed to surround the entire circumference of the lower electrode 31.

As illustrated in FIG. 5, a bank 232 of an organic EL display device 201 includes a hygroscopic portion 232A and a less-hygroscopic portion 232B. The hygroscopic portion 232A is made of the same hygroscopic material as that of the above-described hygroscopic portion 132A. The less-hygroscopic portion 232B is made of a material (for example, the above-described resin such as polyimide or acryl) different from that of the hygroscopic portion 232A. The hygroscopic portion 232A is formed above the less-hygroscopic portion 232B. According to this bank 232, since the hygroscopic portion 232A containing the hygroscopic material is in contact with the organic layer 33, it is possible to more effectively reduce an influence of moisture on the organic layer 33. In the example illustrated in FIG. 5, the hygroscopic portion 232A is formed to cover the less-hygroscopic portion 232B and thus forms a surface (an upper surface and a side surface which are in contact with the organic layer 33) of the bank 232. The hygroscopic portion 232A may be formed only on the upper surface of the less-hygroscopic portion 232B.

The hygroscopic portion 232A is also provided at each of the plurality of pixels. Preferably, the hygroscopic portion 232A surrounds the entire circumference of the lower electrode 31. The hygroscopic portion 232A is not necessarily limited thereto. For example, among the above-described four outer edges of the lower electrode 31, there may be an edge at which the hygroscopic portion 232A is not formed. In other words, the hygroscopic portion 232A is formed only along two adjacent edges among the four outer edges of the lower electrode 31, or only along three edges among the four outer edges. For example, the hygroscopic portion 232A may be formed only along the upper and right edges of the lower electrode 31.

Figure 6:
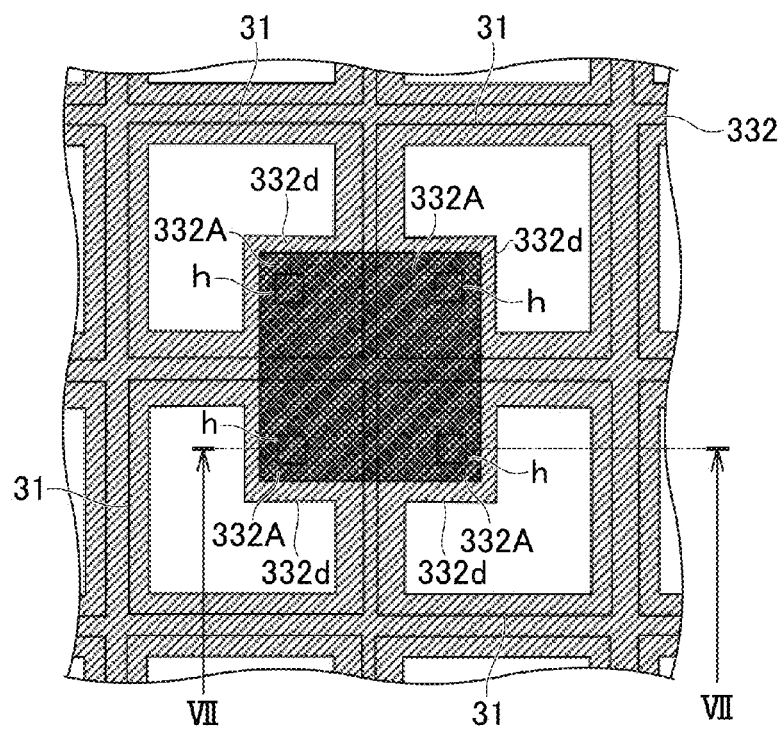
FIG. 6 is a plan view illustrating a modification example of a bank.
Figure 7:
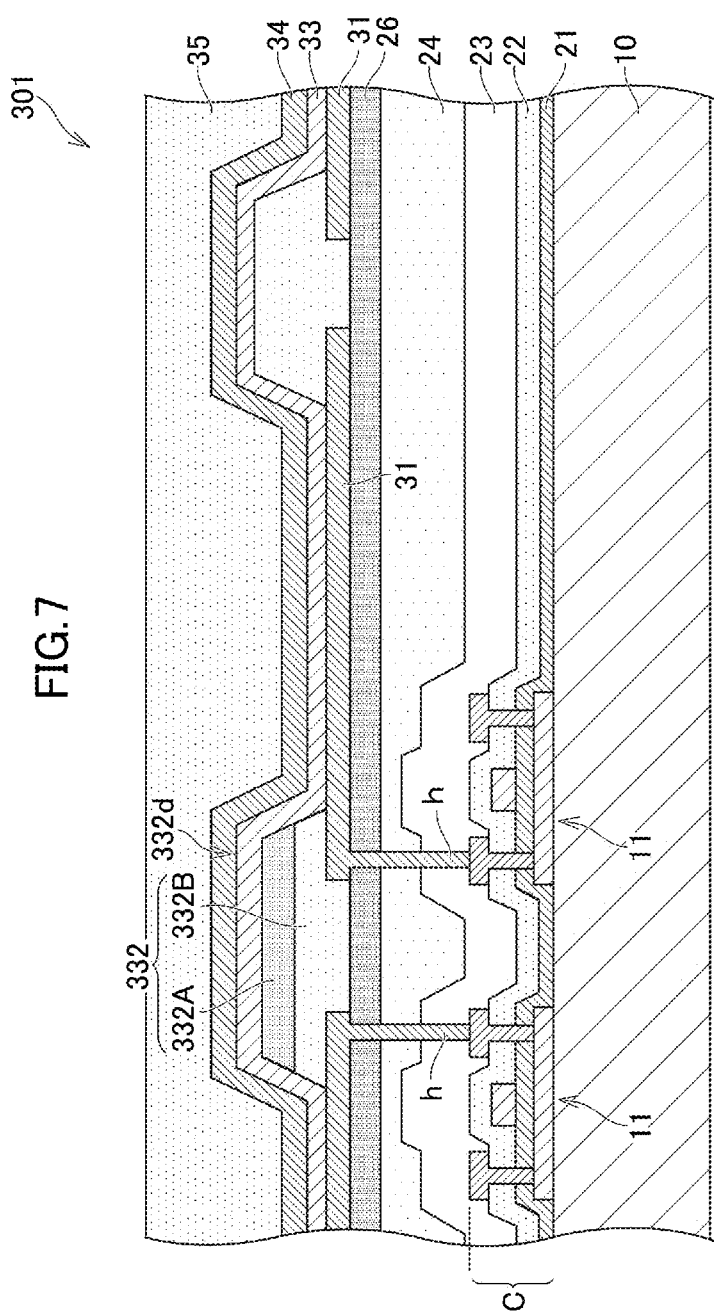
FIG. 7 is a cross-sectional view of the organic EL display device taken along the line VII-VII illustrated in FIG. 6.

A hygroscopic portion provided at each pixel may not necessarily surround the entire circumference of the lower electrode 31. FIGS. 6 and 7 are diagrams illustrating an organic EL display device 301 according to still another modification example. FIG. 6 is a plan view illustrating a bank and a lower electrode, and FIG. 7 is a cross-sectional view of the organic EL display device 301 taken along the line VII-VII illustrated in FIG. 6. In the figures, the same members as the members described hitherto are given the same reference numerals.

A bank 332 illustrated in FIGS. 6 and 7 has a projecting portion 332d which covers the portion where the contact hole h is formed in the lower electrode 31 in the same manner as the bank 32. The bank 332 includes a hygroscopic portion 332A made of a hygroscopic material at the projecting portion 332d. The hygroscopic portion 332A is formed to cover the position where the contact hole h is formed. The hygroscopic portion 332A is formed only at the projecting portion 332d. A wider hygroscopic portion 332A is secured in the projecting portion 332d than in other portions of the bank 332. For this reason, even in a case where a hygroscopic material is a material which is difficult to be patterned in a narrow region, it is possible to easily form the hygroscopic portion 332A containing the hygroscopic material. In other words, even in a case where a portion containing a hygroscopic material has a limitation in the minimum dimension (the minimum width), the portion containing the hygroscopic material can be provided at each pixel.

The bank 332 includes a less-hygroscopic portion 332B which is made of a material (for example, the above-described resin such as polyimide or acryl) having a hygroscopic performance lower than that of the hygroscopic portion 332A. The hygroscopic portion 332A in the example illustrated in FIGS. 6 and 7 is formed above the less-hygroscopic portion 332B. The hygroscopic portion 332A is not limited thereto. For example, the less-hygroscopic portion 332B may be formed above the hygroscopic portion 332A.

In the organic EL display device 301, as described above, four pixels form a single unit. In other words, a single pixel is formed of four sub-pixels. The four pixels (sub-pixels) are arranged so that the portions where the contact holes h are formed are close to each other. In other words, the four pixels are arranged in a linearly-symmetric arrangement with respect to the vertical straight line and the horizontal straight line. Accordingly, the portions where the contact holes h are formed are located close to each other. The hygroscopic portions 332A are formed over the projecting portions 332d of the four pixels. In other words, four hygroscopic portions 332A which are respectively formed at the four projecting portions 332d are continuously located. For this reason, it is possible to secure an appropriate overall width for the continuously located hygroscopic portions 332A. As a result, even in a case where a hygroscopic material is a material which is difficult to be patterned in a narrow region, it is possible to more easily form the hygroscopic portion 332A.

In addition, a plurality of pixels forming the single unit may not have the above-described arrangement. For example, a plurality of pixels may be arranged in a linearly-symmetric arrangement with respect to only one of the vertical straight line and the horizontal straight line. In this case, the hygroscopic portion 332A may be formed over the projecting portions 332d of two pixels.

The organic EL display device 301 illustrated in FIG. 7 includes a layer which is made of a hygroscopic material and is closer to the substrate 10 than to the organic layer 33. Specifically, the organic EL display device 301 illustrated in FIG. 7 has a hygroscopic layer 26 made of a hygroscopic material, formed on the above-described planarizing layer 24. The lower electrode 31 and the bank 32 are formed on the hygroscopic layer 26. According to the hygroscopic layer 26, it is possible to more effectively reduce an influence of moisture on the organic layer. In the example illustrated in FIG. 7, since the hygroscopic layer 26 which is in contact with the lower electrode 31 contains a hygroscopic material, a distance between the hygroscopic material and the organic layer 33 is relatively short. For this reason, it is possible to more effectively reduce an influence of moisture on the organic layer 33. In addition, in a manufacturing process of the organic EL display device, moisture contained in the hygroscopic layer 26 can be removed therefrom by performing an annealing process on the hygroscopic layer 26 before forming the organic layer 33.

As exemplified in FIG. 7, the organic EL display device 1 may include a layer which is made of a hygroscopic material, separately from the bank. FIGS. 8, 9, 10 and 11 are cross-sectional views illustrating still another modification example of an organic EL display device. In the figures, the same members as the members described hitherto are given the same reference numerals. In addition, a cross section of the figures is the same as that of FIG. 3.

Figure 8:
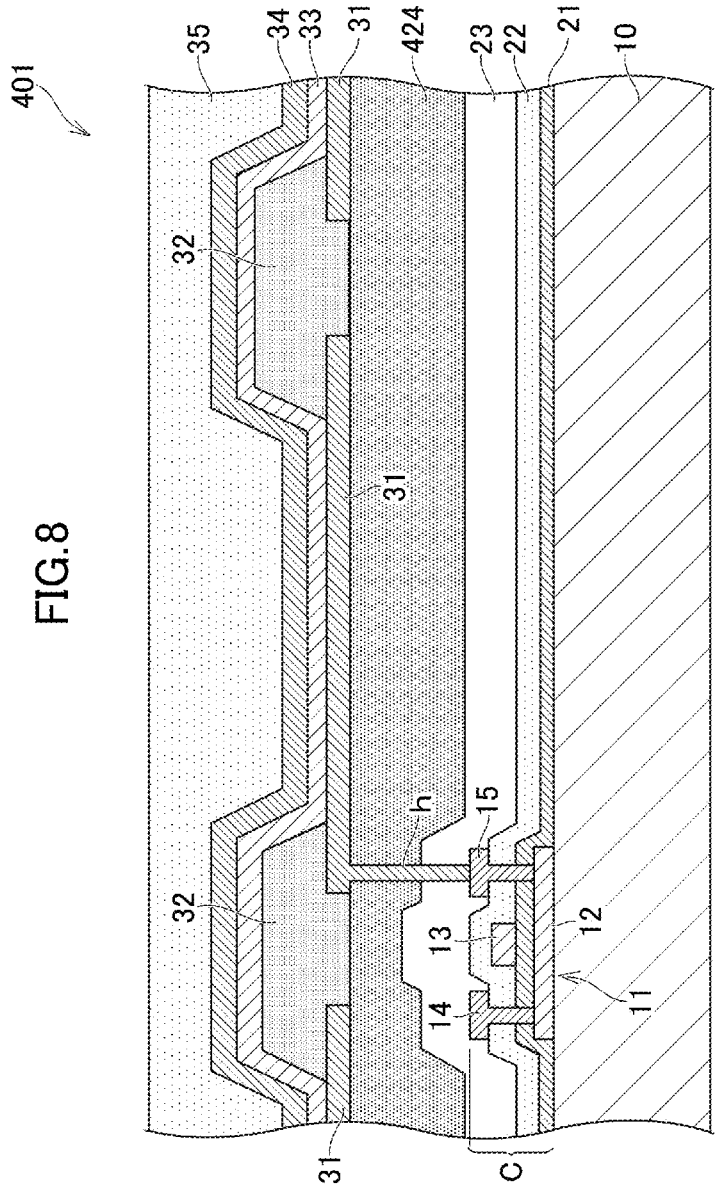
FIG. 8 is a cross-sectional view illustrating a modification example of the organic EL display device.

An organic EL display device 401 illustrated in FIG. 8 includes a layer which is made of a hygroscopic material and is located further toward the substrate 10 than the organic layer 33. That is, the organic EL display device 401 includes a layer which is made of a hygroscopic material and is located between the substrate 10 and the organic layer 33. In other words, the layer made of a hygroscopic material is provided in a layer lower than the organic layer 33. The organic EL display device 401 includes a planarizing layer 424 instead of the above-described planarizing layer 24. The planarizing layer 424 is made of a hygroscopic material. The organic EL display device 401 includes the bank 32 in the same manner as the organic EL display device 1 described hitherto. For this reason, it is possible to more effectively reduce an influence of moisture on the organic layer 33. The organic EL display device 401 may have the above-described bank 132, bank 232, or bank 332 instead of the bank 32.

According to the above-described structure in which the layer containing a hygroscopic material is located between the substrate 10 and the organic layer 33, in a manufacturing process of the organic EL display device, moisture contained in the hygroscopic material can be removed therefrom by performing an annealing process on the layers (the planarizing layer 424 and the bank 32) containing the hygroscopic material before forming the organic layer 33. As a result, it is possible to effectively reduce an influence of moisture on the organic layer 33. In addition, in the example illustrated in FIG. 8, since the planarizing layer 424 which is in contact with the lower electrode 31 contains a hygroscopic material, a distance between the hygroscopic material and the organic layer 33 is relatively short. For this reason, it is possible to more effectively reduce an influence of moisture on the organic layer 33.

Figure 9:
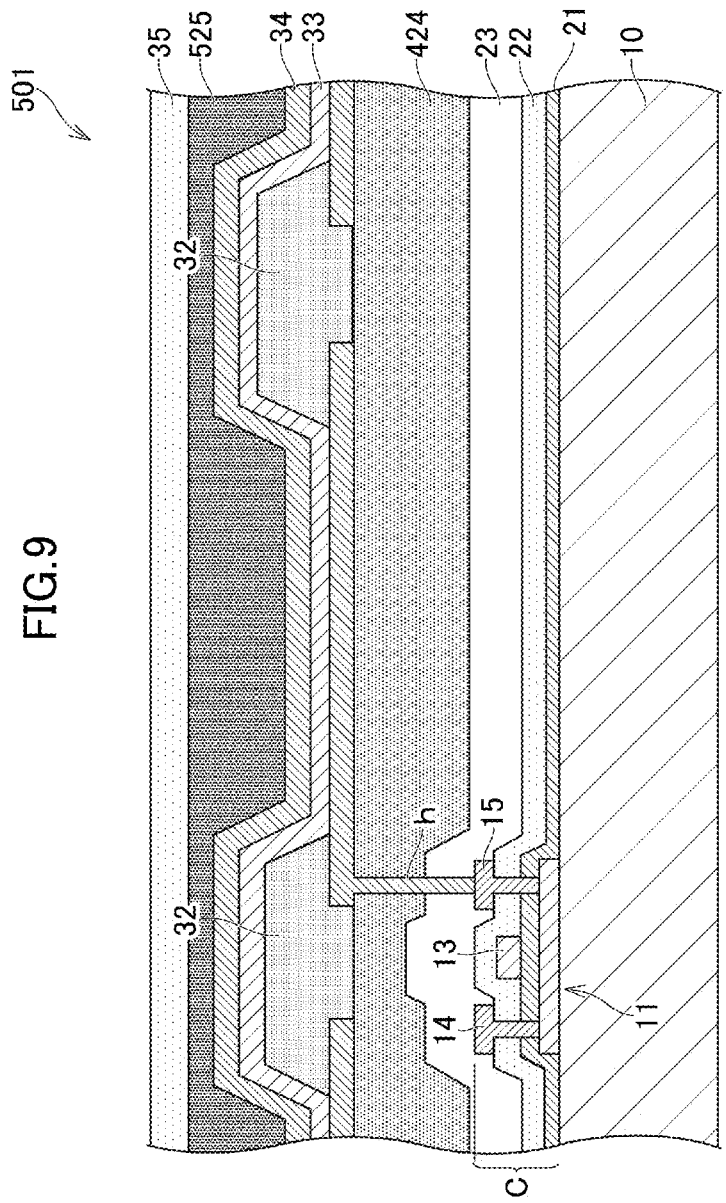
FIG. 9 is a cross-sectional view illustrating another modification example of the organic EL display device.

An organic EL display device 501 illustrated in FIG. 9 includes a hygroscopic layer 525 which is formed on the upper electrode 34 and is made of a hygroscopic material, in addition to the planarizing layer 424 containing a hygroscopic material. The hygroscopic layer 525 is formed to cover the upper electrode 34. The organic EL display device 501 has the above-described bank 32 and the planarizing layer 424 made of a hygroscopic material. According to the organic EL display device 501, it is possible to more effectively reduce an influence of moisture on the organic layer 33. A method of forming the hygroscopic layer 525 is not particularly limited. The hygroscopic layer may be formed, for example, by coating a hygroscopic material on the upper electrode 34. The organic EL display device 501 may have the above-described bank 132, bank 232, or bank 332 instead of the bank 32.

Figure 10:
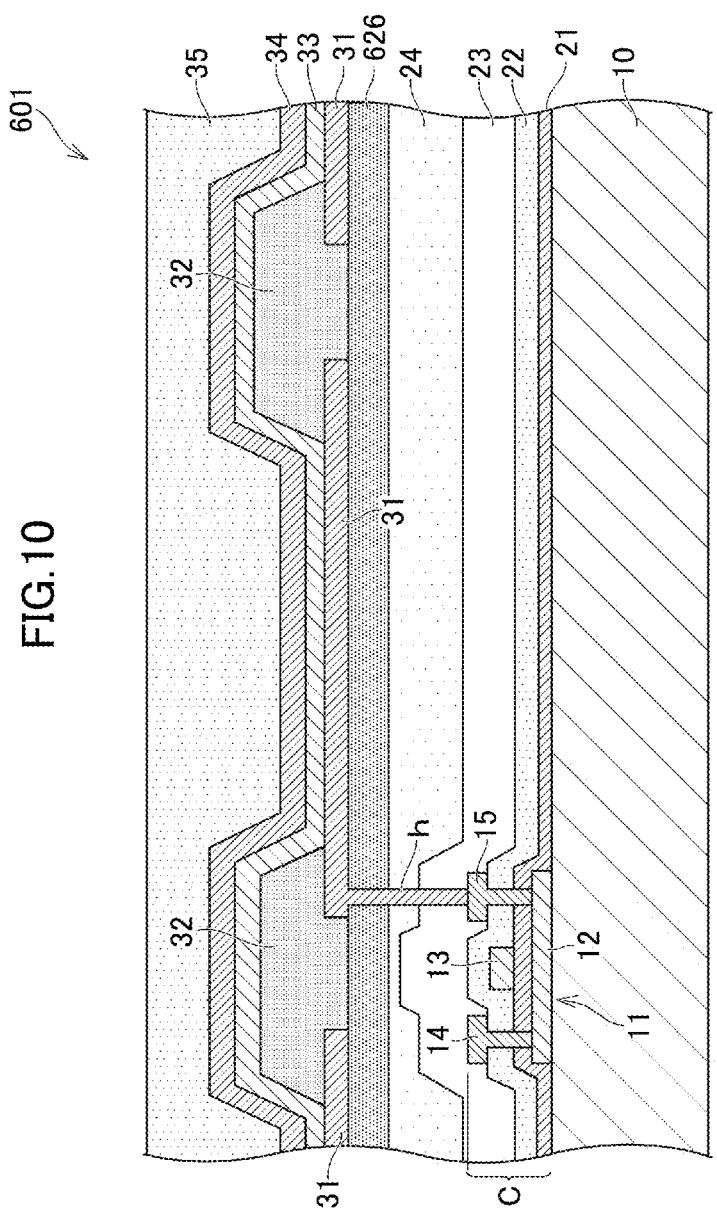
FIG. 10 is a cross-sectional view illustrating still another modification example of the organic EL display device.

As illustrated in FIG. 10, an organic EL display device 601 also includes a layer which is made of a hygroscopic material and is located further toward the substrate 10 than the organic layer 33. That is, the organic EL display device 601 also includes a layer which is made of a hygroscopic material and is located between the substrate 10 and the organic layer 33. In other words, the organic EL display device 601 also has the layer made of a hygroscopic material in a layer lower than the organic layer 33. Specifically, the organic EL display device 601 includes a hygroscopic layer 626 on the above-described planarizing layer 24. The lower electrode 31 and the bank 32 are formed on the hygroscopic layer 626.

According to the above-described structure of the organic EL display device 601, in a manufacturing process of the organic EL display device, moisture contained in the hygroscopic layer 626 can be removed therefrom by performing an annealing process on the hygroscopic layer 626 before forming the organic layer 33. As a result, it is possible to more effectively reduce an influence of moisture on the organic layer 33. In addition, in the example illustrated in FIG. 9, since the hygroscopic layer 626 which is in contact with the lower electrode 31 contains a hygroscopic material, a distance between the hygroscopic material and the organic layer 33 is relatively short. For this reason, it is possible to effectively reduce an influence of moisture on the organic layer 33.

The organic EL display device 601 includes the bank 32 in the same manner as the organic EL display device 1 described hitherto. For this reason, it is possible to more effectively reduce an influence of moisture on the organic layer 33. The organic EL display device 601 may have the above-described bank 132, bank 232, or bank 332 instead of the bank 32.

Figure 11:
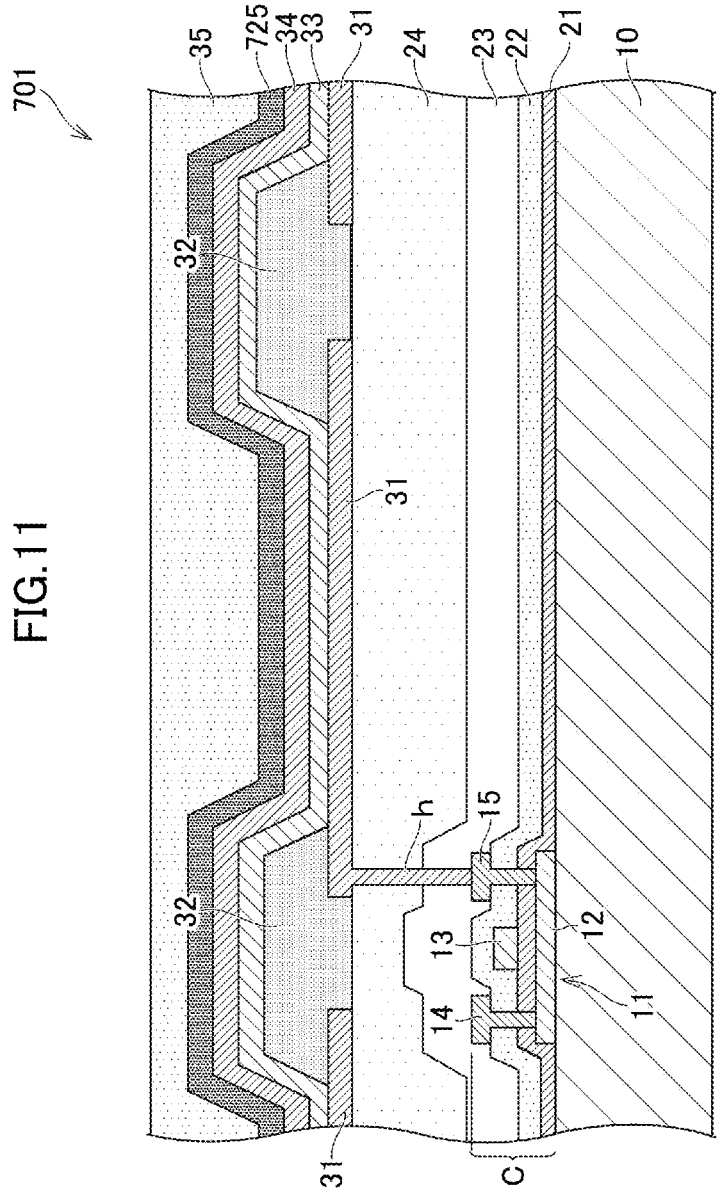
FIG. 11 is a cross-sectional view illustrating still another modification example of the organic EL display device.

An organic EL display device 701 illustrated in FIG. 11 includes a hygroscopic layer 725 which is formed on the upper electrode 34 and is made of a hygroscopic material. The hygroscopic layer 725 is formed to cover the upper electrode 34. The organic EL display device 701 includes the above-described bank 32. According to the organic EL display device 701, it is possible to more effectively reduce an influence of moisture on the organic layer 33 than in the above-described organic EL display device 1. The organic EL display device 701 may have the above-described bank 132, bank 232, or bank 332 instead of the bank 32.

A person skilled in the art can conceive of various modifications and alterations in the category of the idea of the present invention, and it is understood that the modifications and the alterations fall within the scope of the present invention as long as they have the spirit of the present invention.

What is claimed is:

1. An organic EL display device comprising:
a lower electrode provided at each pixel;
a bank surrounding an outer circumference of the lower electrode and located on an outer circumferential edge of the lower electrode;
an organic layer formed on the lower electrode and the bank; and
an upper electrode formed on the organic layer,
wherein the bank has an area including a first portion and a second portion between the first portion and the upper electrode,
the first portion contains a hygroscopic material,
the second portion is made of a material different from the hygroscopic material, and
the second portion forms a surface of the bank, and surrounds a top surface and side surfaces of the first portion.

2. The organic EL display device according to claim 1, wherein the first portion is made of the hygroscopic material or a material into which the hygroscopic material is mixed.

3. The organic EL display device according to claim 1, further comprising a plurality of pixels,
wherein the first portion is provided at each of the plurality of pixels.

4. The organic EL display device according to claim 1, further comprising a circuit layer formed below the lower electrode and connected to the lower electrode through a contact hole,
wherein the first portion includes a region covering the contact hole.

5. The organic EL display device according to claim 1, wherein the outer circumferential edge of the lower electrode includes a plurality of outer edges which extend in different directions each other, and
wherein the first portion is located above two adjacent outer edges among the plurality of outer edges of the lower electrode, and is not located on other outer edges.

6. The organic EL display device according to claim 1, wherein the hygroscopic material includes an alkaline earth metal oxide.

7. The organic EL display device according to claim 1, wherein the hygroscopic material includes any one of calcium oxide, barium oxide, magnesium oxide, strontium oxide, and radium oxide.

8. The organic EL display device according to claim 1, wherein the hygroscopic material includes a sulfate.

9. The organic EL display device according to claim 1, wherein the hygroscopic material includes any one of lithium sulfate, sodium sulfate, gallium sulfate, titanium sulfate, and nickel sulfate.

10. The organic EL display device according to claim 1, wherein the hygroscopic material includes silica gel.

11. An organic EL display device comprising:
a substrate;
a lower electrode formed on the substrate and provided at each pixel;
a bank surrounding an outer circumference of the lower electrode;
an organic layer formed on the lower electrode and the bank;
an upper electrode formed on the organic layer;
a sealing layer formed above the upper electrode;
a first layer formed between the substrate and the organic layer, and containing a hygroscopic material; and
a second layer formed above the upper electrode, containing a hygroscopic material, and surrounding a top surface and side surfaces of the bank.

12. The organic EL display device according to claim 11, wherein the first layer containing the hygroscopic material is a planarizing layer which is provided between the lower electrode and the substrate.

13. The organic EL display device according to claim 11, wherein the first layer containing the hygroscopic material is a layer which is located under the lower electrode and in physical contact with the lower electrode.

14. The organic EL display device according to claim 11, further comprising:
a thin film transistor below the lower electrode; and
a planarizing layer that is provided between the lower electrode and the thin film transistor and does not contain a hygroscopic material,
wherein the planarizing layer covers the thin film transistor and has a planarized surface at an opposite side of the thin film transistor, and
the first layer containing the hygroscopic material is disposed on the planarizing layer.

15. The organic EL display device according to claim 11, wherein the hygroscopic material includes an alkaline earth metal oxide.

16. The organic EL display device according to claim 11, wherein the hygroscopic material includes a sulfate.

17. The organic EL display device according to claim 11, wherein the hygroscopic material includes silica gel.

18. The organic EL display device according to claim 1, wherein the first portion has a top surface and a side surface intersecting at an angle to the top surface, and
the second portion covers the top surface and the side surface.

19. The organic EL display device according to claim 5, further comprising a thin film transistor formed below the lower electrode and connected to the lower electrode through a contact hole,
wherein the contact hole is located at a corner of the lower electrode, the corner facing both of the two adjacent outer edges, and
the first portion covering the contact hole.

20. The organic EL display device according to claim 11, wherein the second layer is located between the upper electrode and the sealing layer.

21. An organic EL display device comprising:
a display region including a first pixel, a second pixel, and a third pixel;
a lower electrode provided at each of the first to third pixels;
a bank surrounding an outer circumference of the lower electrode and located on an outer circumferential edge of the lower electrode;
an organic layer formed on the lower electrode and the bank;
an upper electrode formed on the organic layer;
a thin film transistor formed below the lower electrode; and
a contact hole through which the thin film transistor is connected to the lower electrode,
wherein the bank has an area including a first portion and a second portion below the first portion,
the first portion contains a hygroscopic material,
the second portion is made of a material different from the hygroscopic material,
the first portion forms a surface of the bank,
the display region has a first boundary region between the first and second pixels and a second boundary region between the second and third pixels,
the first boundary region includes the contact hole,
the second boundary region does not include the contact hole,
the first portion overlaps the first boundary region and does not overlap the second boundary region in a planar view, and
the bank has an area not including the first portion and overlapping the second boundary region in a planar view.

22. The organic EL display device according to claim 21, wherein the second portion has a top surface and a side surface intersecting at an angle to the top surface, and
the first portion covers the top surface and the side surface.

23. The organic EL display device according to claim 21, further comprising a thin film transistor formed below the lower electrode; and
a contact hole through which the thin film transistor is connected to the lower electrode,
wherein the contact hole is located at a corner of the lower electrode, the corner facing both of the two adjacent outer edges,
the outer circumferential edge of the lower electrode includes a plurality of outer edges which extend in different directions each other,
the first portion is located above the two adjacent outer edges among the plurality of outer edges, and is not located on other of outer edges, and
the first portion overlapping the contact hole in a planar view.

* * * * *